United States Patent
Lo et al.

(10) Patent No.: US 8,487,324 B2
(45) Date of Patent: Jul. 16, 2013

(54) LIGHT-EMITTING DIODE AND METHOD FOR MAKING THE SAME

(75) Inventors: Hsin-Ming Lo, Pingtung County (TW); Shih-Chang Shei, Tainan (TW)

(73) Assignee: Aceplux Optotech Inc, Tainan (TW)

( * ) Notice: Subject to any disclaimer, the term of this patent is extended or adjusted under 35 U.S.C. 154(b) by 0 days.

(21) Appl. No.: 13/405,950

(22) Filed: Feb. 27, 2012

(65) Prior Publication Data

US 2012/0305948 A1    Dec. 6, 2012

(30) Foreign Application Priority Data

May 31, 2011   (TW) .............................. 100119056 A

(51) Int. Cl.
*H01L 33/00*    (2010.01)
(52) U.S. Cl.
USPC .................. 257/88; 257/95; 257/98; 438/29; 438/34

(58) Field of Classification Search
USPC .................. 257/88, 95, 98, E33.012; 438/34, 438/29
See application file for complete search history.

(56) References Cited

U.S. PATENT DOCUMENTS

| 8,395,167 | B2 * | 3/2013 | Kang et al. ...................... 257/95 |
| 2002/0034835 | A1 * | 3/2002 | Chen et al. ...................... 438/29 |

* cited by examiner

*Primary Examiner* — Theresa T Doan
(74) *Attorney, Agent, or Firm* — Frommer Lawrence & Haug LLP; Ronald R. Santucci

(57) ABSTRACT

A light-emitting diode includes: an epitaxial substrate including a base member, and a plurality of spaced apart first light-transmissive members; a light-emitting unit including a first-type semiconductor layer, a light-emitting layer, and a second-type semiconductor layer; and an electrode unit electrically connected to the light-emitting unit. The first-type semiconductor layer has a bottom film covering the first light-transmissive members, a plurality of spaced apart second light-transmissive members formed on a top face of the bottom film, and a top film formed on the bottom film to cover the second light-transmissive members.

7 Claims, 6 Drawing Sheets

LIGHT-EMITTING DIODE AND METHOD FOR MAKING THE SAME

CROSS-REFERENCE TO RELATED APPLICATION

This application claims priority of Taiwanese application No. 100119056, filed on May 31, 2011, the disclosure of which is incorporated herein by reference.

BACKGROUND OF THE INVENTION

1. Field of the Invention

This invention relates to a light-emitting diode and a method for making the same, more particularly to a light-emitting diode having a relatively high light extraction efficiency and a method for making the same.

2. Description of the Related Art

Referring to FIG. 1, a conventional light-emitting diode (LED) includes an epitaxial substrate 11, a light-emitting unit 12 and an electrode unit 13. The light-emitting unit 12 includes a first-type semiconductor layer 121 formed on the epitaxial substrate 11, a light-emitting layer 122 formed on a portion of the first-type semiconductor layer 121, and a second-type semiconductor layer 123 formed on the light-emitting layer 122. The electrode unit 13 includes a first electrode 131 electrically connected to the first-type semiconductor layer 121, and a second electrode 132 electrically connected to the second-type semiconductor layer 123. When electricity is supplied to the light-emitting unit 12 through the first and second electrodes 131, 132, the light-emitting unit 12 will emit light by virtue of the photovoltaic effect.

In general, the photoelectric efficiency of an LED is represented by an external quantum efficiency of the LED, which is a product of an internal quantum efficiency and light extraction efficiency of the LED. The light extraction efficiency means a ratio of the photon amount departing from the LED to the photon amount generated by the light-emitting layer 122. However, a GaN-based semiconductor material, which is a commonly used material for the light-emitting layer 122, has a refractive index of about 2.5. The refractive index of air is 1. Accordingly, when the light emitted from the light-emitting layer 122 travels to an interface between the light-emitting unit 12 and air, most of the light will be totally reflected and may not be emitted outwardly. Thus, the actual light extraction efficiency of the conventional LED is about 4% which is insufficient for photoelectric efficiency.

In order to enhance the light extraction efficiency of the LED, the epitaxial substrate 11 is normally etched to have a regular or irregular rough structure. Alternatively, a structure of a light-emitting surface of the light-emitting unit 12 may be varied to reduce the ratio of the total reflection at the interface between the light-emitting unit 12 and air, thereby enhancing the light extraction efficiency of the LED. However, when roughening the light-emitting surface of the light-emitting unit 12 using an etching process, the electrical properties of the LED may be adversely affected. In the case of patterning the epitaxial substrate 11 to have the rough structure, the epitaxial substrate 11 for the LED is commonly made of silicon, silicon carbide, aluminum oxide, etc., and is difficult to be etched. Accordingly, the etching process for forming the rough structure is time-consuming. Besides, the rough structure may have poor dimensional accuracy, thereby resulting in uneven luminance of the LED.

SUMMARY OF THE INVENTION

Therefore, an object of the present invention is to provide a light-emitting diode and a method for making the same that can overcome the aforesaid drawbacks associated with the prior art.

According to a first aspect of this invention, a light-emitting diode comprises:

an epitaxial substrate including a base member, and a plurality of spaced apart first light-transmissive members each of which is formed on and tapers from an upper surface of the base member, and each of which is made of a first light-transmissive material having a refractive index lower than that of the base member;

a light-emitting unit including a first-type semiconductor layer that is formed on the epitaxial substrate, a light-emitting layer that is formed on the first-type semiconductor layer opposite to the epitaxial substrate, and a second-type semiconductor layer that is formed on the light-emitting layer opposite to the first-type semiconductor layer; and an electrode unit electrically connected to the light-emitting unit;

wherein the first-type semiconductor layer has a bottom film covering the first light-transmissive members, a plurality of spaced apart second light-transmissive members formed on a top face of the bottom film, and a Lop film formed on the bottom film to cover the second light-transmissive members; and wherein each of the second light-transmissive members tapers from the top face of the bottom film, and is made a second light-transmissive material having a refractive index different from that of the bottom and top films.

According to a second aspect of this invention, a method for making a light-emitting diode comprises:

(a) forming over a base member a first light-transmissive layer that is made of a first light-transmissive material having a refractive index lower than that of the base member;

(b) forming a first patterned mask over the first light-transmissive layer;

(c) heat-treating the first patterned mask at a temperature not higher than a glass transition temperature of the first patterned mask;

(d) performing a dry-etching treatment on the first light-transmissive layer and the first patterned mask that is heat-treated, so that the first light-transmissive Layer is formed into a plurality of spaced apart first light-transmissive members, followed by removing the first patterned mask from the first light-transmissive members;

(e) forming a bottom film to cover the base member and the first light-transmissive members, the bottom film being made of a first-type semiconductor material;

(f) forming over the bottom film a second light-transmissive layer, and forming a second patterned mask over the second light-transmissive layer;

(g) heat-treating the second patterned mask at a temperature not higher than a glass transition temperature of the second patterned mask;

(h) performing a dry-etching treatment on the second light-transmissive layer and the second patterned mask that is heat-treated, so that the second light-transmissive Layer is formed into a plurality of spaced apart second light-transmissive members, followed by removing the second patterned mask from the second light-transmissive members;

(i) forming a top film to cover the bottom film and the second light-transmissive members, the top film being made of the first-type semiconductor material, the top film, the second light-transmissive members and the bottom film constituting a first-type semiconductor layer; and (j) forming a light-emitting layer over the first-type semiconductor layer, followed by forming a second-type semiconductor layer over the light-emitting layer.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
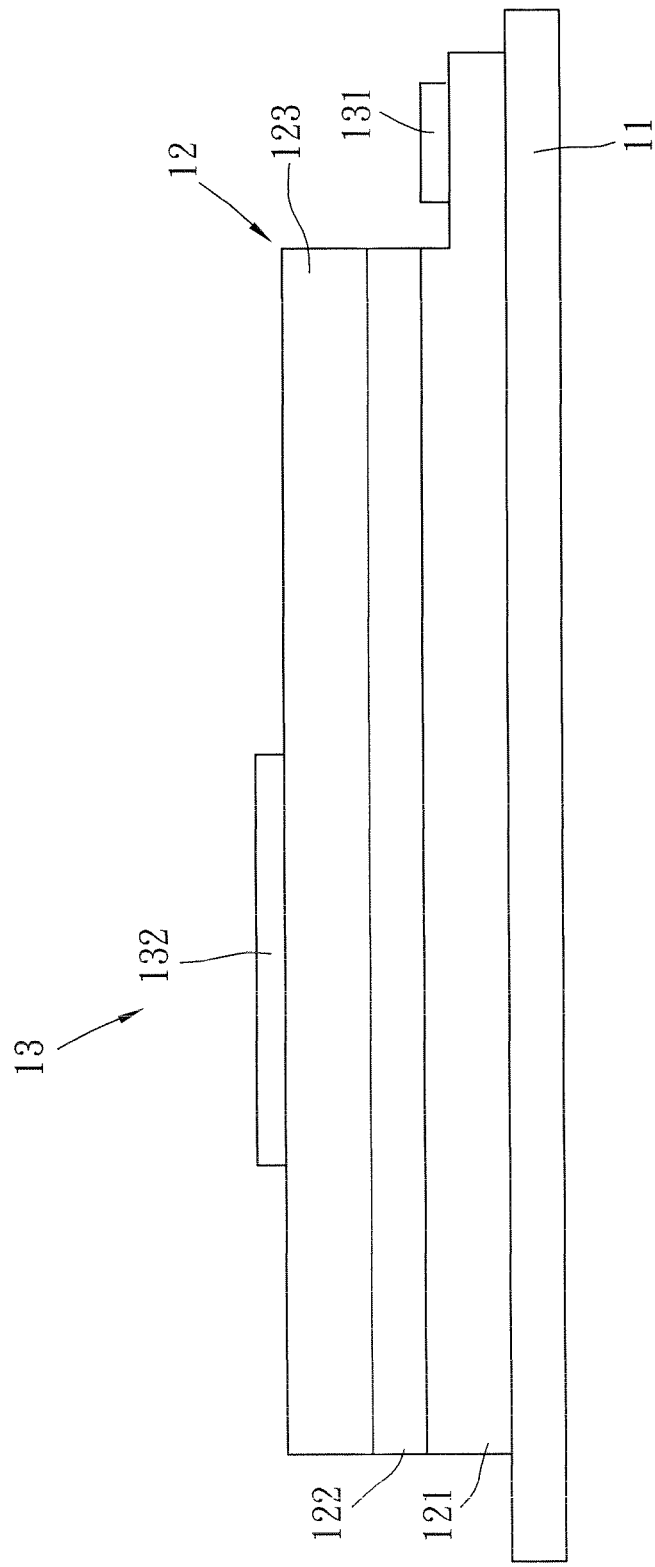
FIG. 1 is a schematic diagram of a conventional light-emitting diode.
Figure 2:
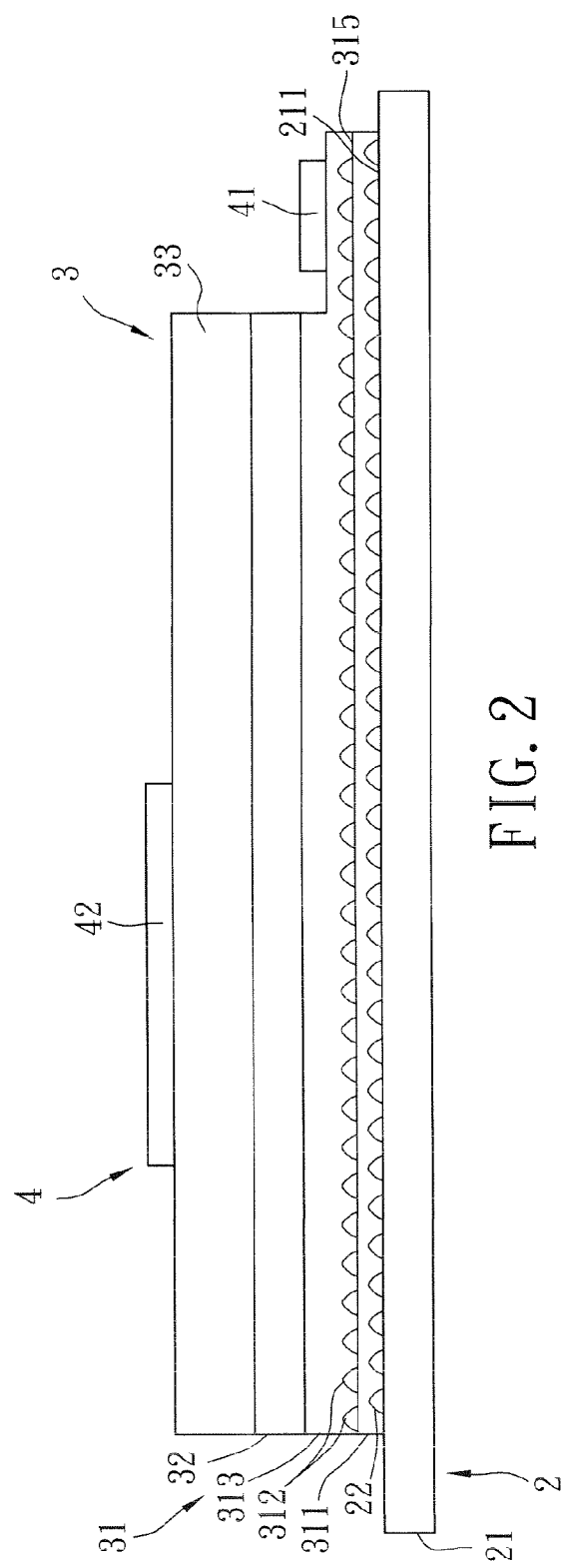
FIG. 2 is a schematic diagram of the preferred embodiment of a light-emitting diode according to this invention.
Figure 3:
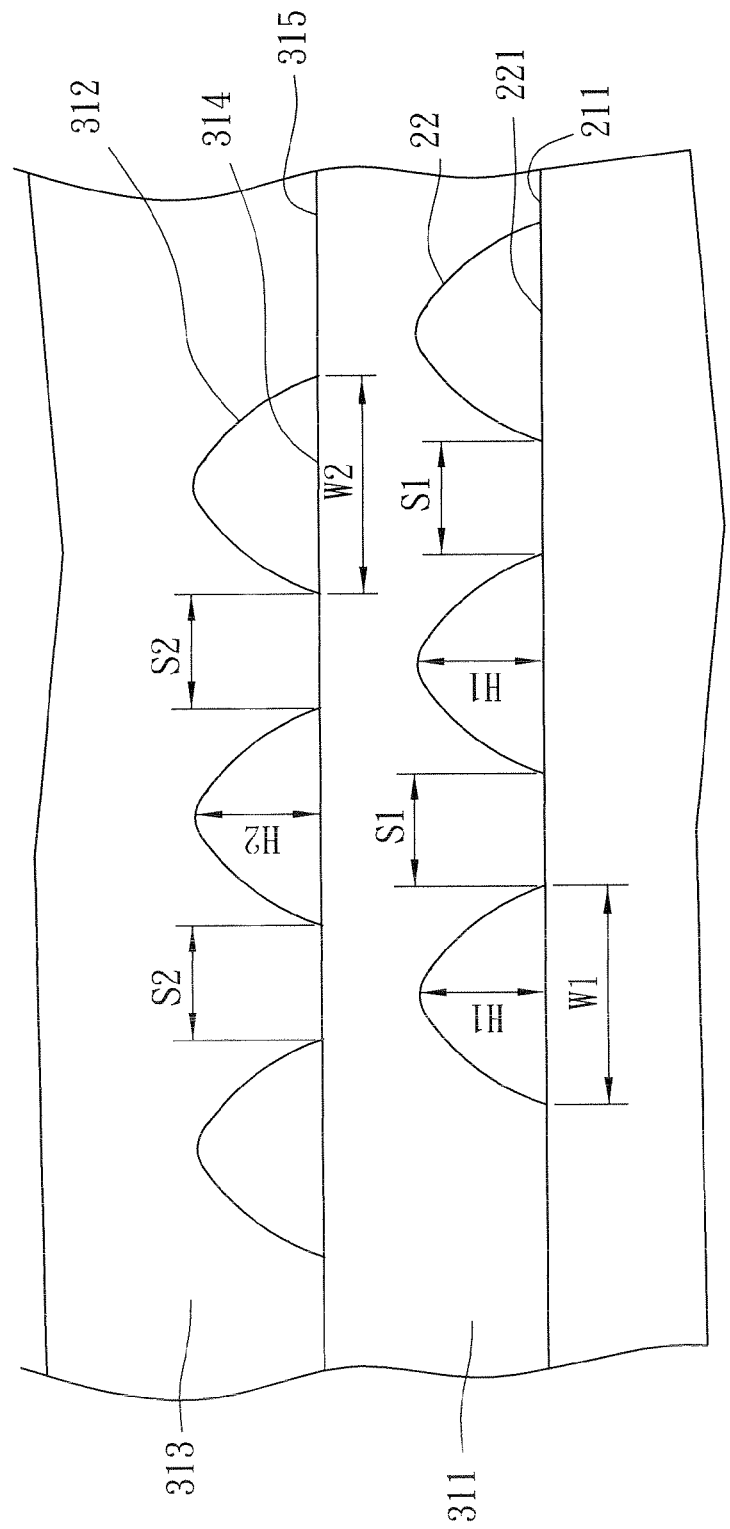
FIG. 3 is a fragmentary enlarged diagram showing first and second light-transmissive members of the preferred embodiment shown in FIG. 2.

Referring to FIGS. 2 and 3, the preferred embodiment of a light-emitting diode (LED) according to this invention includes an epitaxial substrate 2, a light-emitting unit 3, and an electrode unit 4.

The epitaxial substrate 2 includes a base member 21 and a plurality of spaced apart first light-transmissive members 22. The base member 21 has an upper surface 211, and is made from a material selected from the group consisting of silicon, aluminum oxide, silicon carbide, and aluminum nitride. Each of the first light-transmissive members 22 is formed on and tapers from the upper surface 211 of the base member 21, and is made of a first light-transmissive material having a refractive index lower than that of the base member 21. The first light-transmissive material is selected from the group consisting of silicon oxide ($SiO_x$), silicon oxynitride ($SiON_x$), and magnesium fluoride ($MgF_2$). The silicon oxide and the magnesium fluoride are preferable.

The light-emitting unit 3 is disposed on the upper surface 211 of the base member 21, and includes a first-type semiconductor layer 31 that is formed on the epitaxial substrate 2 to cover the first light-transmissive members 22, a light-emitting layer 32 that is formed on the first-type semiconductor layer opposite to the epitaxial substrate 2, and a second-type semiconductor layer 33 that is formed on the light-emitting layer 32 opposite to the first-type semiconductor layer 31. The first-type semiconductor layer 31 has a bottom film 311 covering the first light-transmissive members 22, a plurality of spaced apart second light-transmissive members 312 formed on the bottom film 311, and a top film 313 formed on the bottom film 313 to cover the second light-transmissive members 312. Each of the second light-transmissive members 312 is formed on and tapers from a top face 315 of the bottom film 311, and is made of a second light-transmissive material having a refractive index different from that of the bottom and top films 311, 313. The second light-transmissive material is selected from the group consisting of silicon oxide ($SiO_x$), silicon oxynitride ($SiON_x$), and magnesium fluoride ($MgF_2$).

The electrode unit 4 is electrically connected to the light-emitting unit 3, and includes a first electrode 41 that is formed on the first-type semiconductor layer 31, and a second electrode 42 that is formed on the second-type semiconductor layer 33. When electricity is applied to the light-emitting unit 3 through the first and second electrodes 41, 42, the light-emitting layer 32 emits light by virtue of the photovoltaic effect. After the light from the light-emitting layer 32 travels to the base member 21 and the first and second light-transmissive members 22, 312, it may be reflected or refracted so as to vary the travelling direction of the light and to emit the light outwardly, thereby reducing the total reflection ratio of the light at an interface between the light-emitting unit 3 and air. Accordingly, the light extraction efficiency of the LED of this invention can be enhanced.

In this embodiment, each of the first light-transmissive members 22 is in a cone-shape, and has a first bottom face 221 and a first height (H1) from the bottom face 221. The first bottom face 221 is disposed at the upper surface 211 of the base member 21 and has a maximum width (W1). Each of the second light-transmissive members 312 is also in a cone-shape, and has a second bottom face 314 and a second height (H2) from the second bottom face 314. The second bottom face 314 is disposed at the top face 315 of the bottom film 311 and has a maximum width (W2)

Preferably, the first light-transmissive members 22 are spaced apart from one another by a distance (S1) not greater than 1 μm, and the second light-transmissive members 312 are spaced apart from one another by a distance (S2) not greater than 1 μm. By controlling the distances (S1, S2) to be not greater than 1 μm, the first and second light-transmissive members 22, 312 are arranged in a relatively high density. As such, the light from the light-emitting unit 3 may be efficiently reflected or refracted.

With the first and second light-transmissive members 22, 312, the traveling direction of the light can be easily changed. When a ratio of the first height (H1) to the maximum width (W1) or a ratio of the second height (H2) to the maximum width (W2) is too small, the first height (H1) of the first light-transmissive members 22 or the second height (H2) of the second light-transmissive members 312 is insufficient so that the incident angle of light may be too large, thereby reducing the light extraction efficiency of the LED. Accordingly, the ratio of the first height (H1) to the maximum width (W1) is preferably not less than 0.25, and the ratio of the second height (H2) to the maximum width (W2) is preferably not less than 0.25. It should be noted that, in this specification, the incident angle of the light means an angle between a light incident on a surface of the first or second light-transmissive member 22, 312 and a tangent line of the surface at the point of light incidence.

Figure 4:
FIG. 4 is a fragmentary enlarged diagram of another preferred embodiment of a light-emitting diode according to this invention.

In another preferred embodiment, the bottom film 311 of the first-type semiconductor layer 31 and the first light-transmissive members 22 cooperatively define at least one cavity 23 therebetween (see FIG. 4). With the cavity 23, a relatively large refractive index difference is formed between the cavity 23 and the first-type semiconductor layer 31, and thus, the light traveling toward the base member 21 may be easily reflected to emit outwardly.

Figure 5:
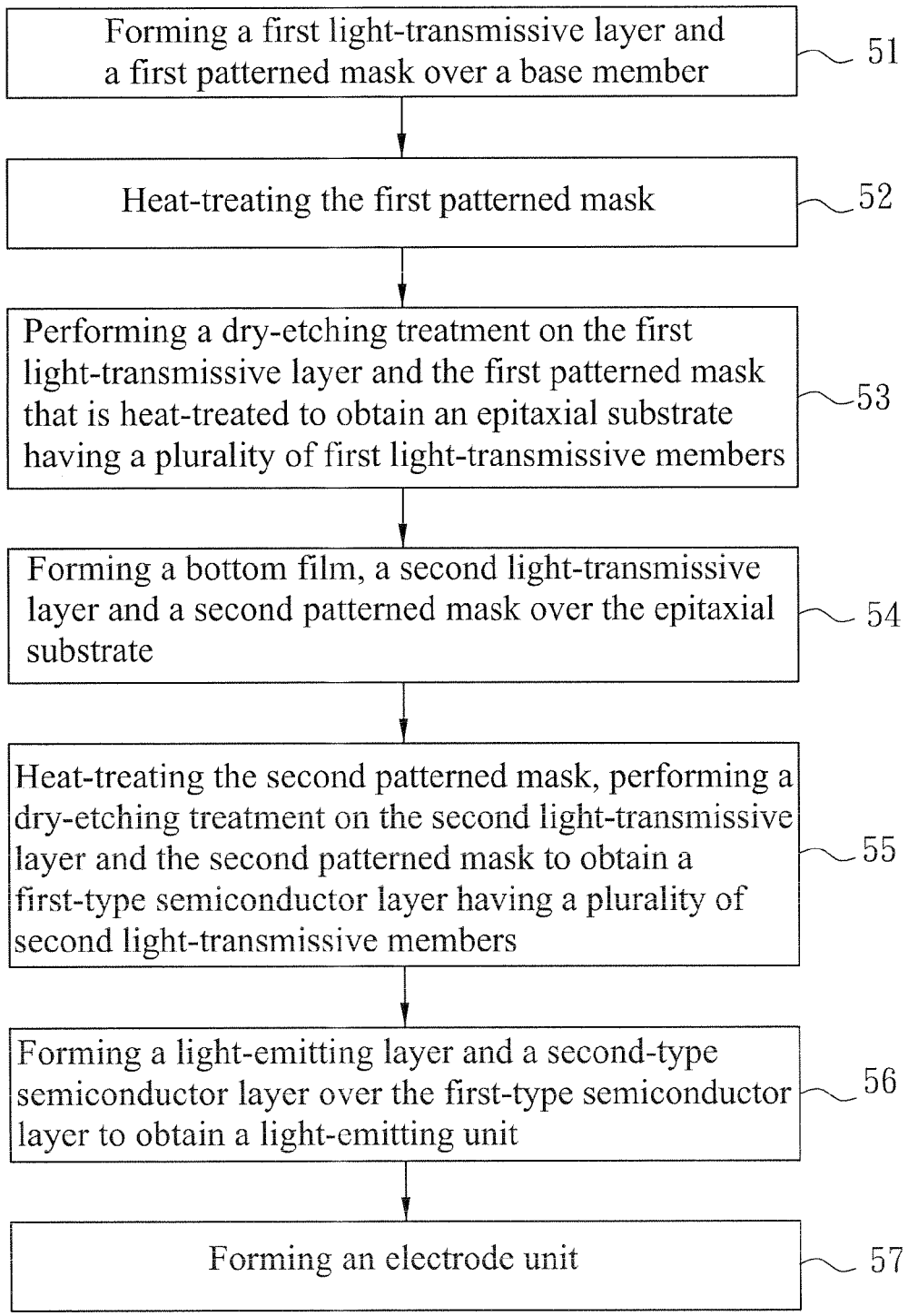
FIG. 5 is a flow chart showing the preferred embodiment of a method for making the light-emitting diode according to this invention.
Figure 6:
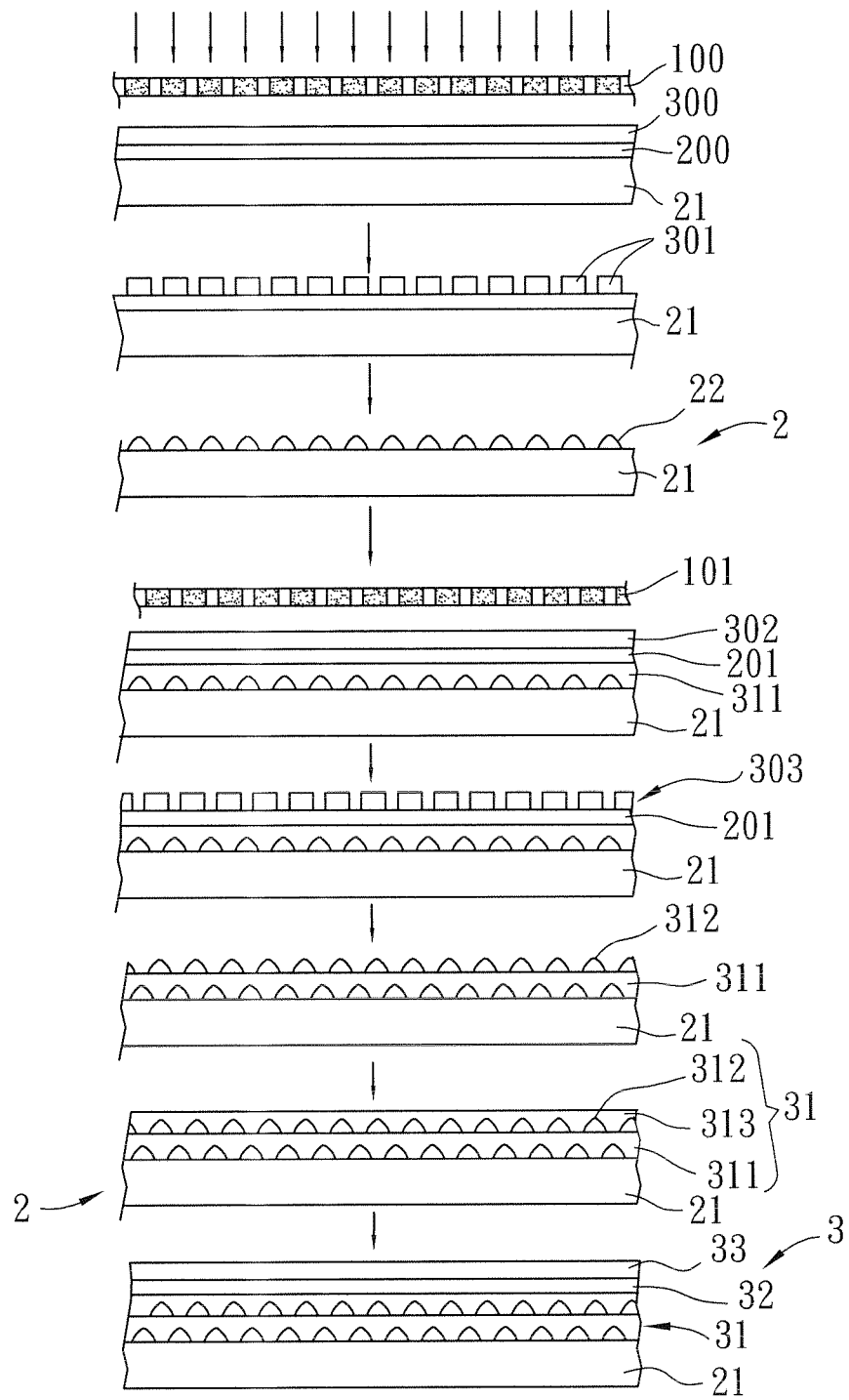
FIG. 6 is a flow diagram illustrating consecutive steps of the method shown in FIG. 5.

Referring to FIGS. 5 and 6, the preferred embodiment of a method for making the light emitting diode according to this invention comprises the following steps.

In step 51, a first light-transmissive layer 200 is formed over a base member 21 using a chemical vapor deposition process, a first mask layer 300 is formed over the first light-transmissive layer 200, and the first mask layer 300 is patterned by a lithography process using a first patterned photomask 100 to obtain a first patterned mask 301 that partially exposes the first light-transmissive layer 200. Since the chemical vapor deposition process and the lithography process are well-known in the art, detailed descriptions thereof are omitted herein for the sake of brevity.

Based on process requirements, the first mask layer 300 can be made of positive-type or negative-type photoresist material. In this embodiment, the first mask layer 300 is made of the positive-type photoresist material. The first light-transmissive layer 200 is made of the first light-transmissive material having a refractive index lower than that of the base member 21, such as silicon oxide ($SiO_x$), silicon oxynitride ($SiON_x$) and magnesium fluoride ($MgF_2$). In consideration of the subsequent high-temperature process for forming a light-emitting unit 3, the first light-transmissive material preferably has a heat resistivity of not less than 1000° C. That is to say, the refractive index and the light transmittance of the first light-transmissive material would not be significantly changed at a temperature of not Less than 1000° C. In practice, the first light-transmissive material will not be processed at a temperature greater than 1200° C. Besides, the first light-transmissive material preferably has the refractive index lower than that of the base member 21 and higher than those of the bottom and top films 311, 313 of the first-type semiconductor layer 31, and thus, is preferably made of silicon oxide ($SiO_x$) or magnesium fluoride ($MgF_2$)

In step 52, the first patterned mask 301 is heat-treated at a temperature not higher than a glass transition temperature (Tg) of the first patterned mask 301, and is preferably heat-treated at a temperature of about 5° C. to 10° C. lower than the Tg of the first patterned mask 301 for about 60 minutes. At such temperature, molecular chain movement inside the first patterned mask 301 occurs so that the first patterned mask 301 is deformed to have a plurality of arch-shaped structures each of which is in a state of its lowest surface energy.

In step 53, a dry-etching treatment is performed to anisotropically etch the first light-transmissive layer 200 and the first patterened mask 301 that is heat-treated, so that the first light-transmissive layer 200 is formed into a plurality of spaced apart first light-transmissive members 22. Thereafter, the first patterned mask 301 is fully removed from the first light-transmissive members 22, thereby obtaining an epitaxial substrate 2 that has the base member 21 and the first light-transmissive members 22.

In the dry-etching treatment, the radio frequency power ranges from about 200 W to 400 W, and the etching gas may be fluorine-containing gas, such as $CF_4$, $SF_6$, $CHF_3$, etc. In this step, an etching ratio of the first light-transmissive layer 200 to the first pattered mask 301 preferably ranges from 1:0.5 to 1:1.5.

In step 54, a bottom film 311 is formed to cover the base member 21 and the first light-transmissive members 22, a second light-transmissive layer 201 and a second mask layer 302 are sequentially formed on the bottom film 311, and the second mask layer 302 is patterned by a lithography process using a second patterned photomask 101 to obtain a second patterned mask 303 that partially exposes the second light-transmissive layer 201. Since the bottom film 311 is made of a first-type semiconductor material that is well-known in the art, and since the materials of the second light-transmissive layer 201 and the second patterned mask 302 and the process for forming the same are substantially the same as those of the first light-transmissive layer 200 and the first patterned mask 301 described in step 51, detailed descriptions thereof are omitted herein for the sake of brevity.

In step 55, the second patterned mask 303 is heat-treated at a temperature not higher than a glass transition temperature (Tg) of the second patterned mask 303, and is preferably heat-treated at a temperature of about 5° C. to 10° C. lower than the Tg of the second patterned mask 303 for about 60 minutes. Then, a dry-etching treatment is performed to anisotropically etch the second light-transmissive Layer 201 and the second patterned mask 301 that is heat-treated, so that the second light-transmissive layer 201 is formed into a plurality of spaced apart second light-transmissive members 312. Thereafter, the second patterned mask 303 is fully removed from the second light-transmissive members 312, and a top film 313 is formed to cover the bottom film 311 and the second light-transmissive members 312. The top film 313 is made of the first-type semiconductor material. The top film 313, the second light-transmissive members 312 and the bottom film 311 constitute the first-type semiconductor layer 31. Besides, since the parameters of the dry-etching treatment in this step are the same as those in step 53, the detailed descriptions thereof are omitted herein for the sake of brevity.

In step 56, a light-emitting layer 32 is formed on the first-type semiconductor layer 31, and a second-type semiconductor layer 33 that has electrical properties opposite to those of the first-type semiconductor layer is formed on the light-emitting layer 32. The first-type semiconductor layer 31, the light-emitting layer 32, and the second-type semiconductor layer 33 constitute the light-emitting unit 3.

In step 57, an electrode unit 4 is formed. Also referring to FIG. 2, in this step, the light-emitting unit 3 is partially and downwardly etched to expose a portion of the first-type semiconductor layer 31, and first and second electrodes 41, 42 are respectively formed on the exposed first-type semiconductor layer 31 and the second-type semiconductor layer 33. The first and second electrodes 41, 42 constitute the electrode unit 4. The suitable materials for the light-emitting unit 3 and the electrode unit 4 are well-known in the art, and detailed descriptions thereof are omitted herein for the sake of brevity.

It should be noted that, when forming the bottom film 311 of the first-type semiconductor layer 31 in step 54, at least one cavity 23 (see FIG. 4) may be formed between the bottom film 317 and the first light-transmissive members 22 if the epitaxial parameters, such as background gas composition, pressure, temperature, etc., are well-controlled.

In this invention, with the tapered first light-transmissive members 22 made of the first light-transmissive material having a refractive index lower than that of the base member 21, and with the tapered second light-transmissive members 312 made of a second light-transmissive material having a refractive index different from that of the bottom and top films 311, 313, the light from the light-emitting layer 32 can be reflected and refracted more efficiently so as to be emitted outwardly, thereby enhancing the light extraction efficiency of the LED according to this invention.

In addition, by the method of this invention, the etching problem for the epitaxial substrate can be eliminated, and thus, the processing time for making the LED of this invention can be reduced. Besides, the method of this invention is relatively simple, and the uniformity and the dimensional accuracy of the light-transmissive members 22 can be easily controlled. As such, the LED made by the method of this invention can emit light evenly.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light-emitting diode, comprising:
an epitaxial substrate including a base member, and a plurality of spaced apart first light-transmissive members each of which is formed on and tapers from an upper surface of said base member, and each of which is made of a first light-transmissive material having a refractive index lower than that of said base member;
a light-emitting unit including a first-type semiconductor layer that is formed on said epitaxial substrate, a light-emitting layer that is formed on said first-type semiconductor layer opposite to said epitaxial substrate, and a second-type semiconductor layer that is formed on said light-emitting layer opposite to said first-type semiconductor layer; and
an electrode unit electrically connected to said light-emitting unit;
wherein said first-type semiconductor layer has a bottom film covering said first light-transmissive members, a plurality of spaced apart second light-transmissive members formed on a top face of said bottom film, and a top film formed on said bottom film to cover said second light-transmissive members; and
wherein each of said second light-transmissive members tapers from said top face of said bottom film, and is made of a second light-transmissive material having a refractive index different from that of said bottom and top films.

2. The light-emitting diode of claim 1, wherein each of said first light-transmissive members is in a cone-shape, and has a first bottom face that is disposed at said upper surface of said base member and that has a maximum width, and a first height from said first bottom face, a ratio of said first height to said maximum width of said first bottom face being not less than 0.25, said first light-transmissive members being spaced apart from one another by a distance not greater than 1 μm.

3. The light-emitting diode of claim 1, wherein said light-emitting unit and said first light-transmissive members cooperatively define at least one cavity therebetween.

4. The light-emitting diode of claim 1, wherein each of said second light-transmissive members is in a cone-shape, and has a second bottom face that is disposed at said top face of said bottom film and that has a maximum width, and a second height from said second bottom face, a ratio of said second height to said maximum width of said second bottom face being not less than 0.25, said second light-transmissive members being spaced apart from one another by a distance not greater than 1 μm.

5. The light-emitting diode of claim 1, wherein said base member is made from a material selected from the group consisting of aluminum oxide, silicon carbide, silicon, and aluminum nitride.

6. The light-emitting diode of claim 1, wherein said first light-transmissive material is selected from the group consisting of silicon oxide, siilicon oxynitride, and magnesium fluoride.

7. The light-emitting diode of claim 1, wherein said second light-transmissive material is selected from the group consisting of silicon oxide, silicon oxynitride, and magnesium fluoride.

* * * * *